(12) United States Patent
Koshimizu

(10) Patent No.: US 8,993,895 B2
(45) Date of Patent: Mar. 31, 2015

(54) MEMBRANE WIRING BOARD

(71) Applicant: Kazutoshi Koshimizu, Saitama (JP)

(72) Inventor: Kazutoshi Koshimizu, Saitama (JP)

(73) Assignee: Fujikura Ltd., Tokyo (JP)

( * ) Notice: Subject to any disclaimer, the term of this patent is extended or adjusted under 35 U.S.C. 154(b) by 166 days.

(21) Appl. No.: 13/631,202

(22) Filed: Sep. 28, 2012

(65) Prior Publication Data

US 2013/0020114 A1  Jan. 24, 2013

Related U.S. Application Data

(63) Continuation of application No. PCT/JP2011/058019, filed on Mar. 30, 2011.

(30) Foreign Application Priority Data

Apr. 1, 2010 (JP) .................................. 2010-084796

(51) Int. Cl.
 H05K 1/09 (2006.01)
 H05K 1/00 (2006.01)
 (Continued)

(52) U.S. Cl.
 CPC ........ H01L 23/4985 (2013.01); H01L 21/4867 (2013.01); H05K 1/095 (2013.01); H05K 3/4664 (2013.01); H05K 2201/0245 (2013.01); H05K 2201/0272 (2013.01); H01L 2924/0002 (2013.01); C09D 11/52 (2013.01); H01B 1/22 (2013.01); C08K 3/08 (2013.01); C08K 7/00 (2013.01); C08K 7/18 (2013.01); C08K 2003/0806 (2013.01); C08K 2201/001 (2013.01); C08K 2201/014 (2013.01); C08K 2201/016 (2013.01); C09D 4/00 (2013.01); C08F 2222/1026 (2013.01)
 USPC ............ 174/257; 174/250; 174/255; 174/256

(58) Field of Classification Search
 CPC ......... H05K 1/092; H05K 1/095; H05K 3/28; H05K 1/0306; H05K 1/056
 USPC .................................. 174/255–257, 250, 260
 See application file for complete search history.

(56) References Cited

U.S. PATENT DOCUMENTS 5,603,158 A * 2/1997 Murata et al. ................... 29/846
7,452,923 B2 * 11/2008 Jeon et al. ........................ 522/90

(Continued)

FOREIGN PATENT DOCUMENTS

CN   101484541 A   7/2009
CN   101484950     7/2009

(Continued)

OTHER PUBLICATIONS

Office Action issued in corresponding Taiwan Patent Application No. 10220381600 dated Mar. 27, 2013.

(Continued)

*Primary Examiner* — Timothy Thompson
*Assistant Examiner* — Sherman Ng
(74) *Attorney, Agent, or Firm* — Sughrue Mion, PLLC

(57) ABSTRACT

The present invention is a membrane wiring board provided with an insulating substrate, and at least one circuit portion provided on the insulating substrate and obtained by coating a circuit layer, formed by an electrically conductive paste containing electrically conductive particles, with an insulating coating layer, wherein the circuit layer contains a resin component having a gel fraction of 90% or more.

5 Claims, 3 Drawing Sheets

(51) Int. Cl.
*H05K 1/03* (2006.01)
*H01L 23/498* (2006.01)
*H01L 21/48* (2006.01)
*H05K 3/46* (2006.01)
*C09D 11/52* (2014.01)
*H01B 1/22* (2006.01)
*C09D 4/00* (2006.01)
*C08K 3/08* (2006.01)
*C08K 7/00* (2006.01)
*C08K 7/18* (2006.01)
*C08F 222/10* (2006.01)

(56) References Cited

U.S. PATENT DOCUMENTS

| | | | |
|---|---|---|---|
| 2004/0044102 A1* | 3/2004 | Hashimoto | 523/400 |
| 2004/0177997 A1* | 9/2004 | Hata et al. | 174/257 |
| 2010/0065311 A1* | 3/2010 | Tanaka et al. | 174/257 |
| 2010/0076109 A1 | 3/2010 | Kang et al. | |

FOREIGN PATENT DOCUMENTS

| | | |
|---|---|---|
| EP | 2 040 268 | 3/2009 |
| JP | 60-080201 A | 5/1985 |
| JP | 02-177388 A | 7/1990 |
| JP | 05-039343 A | 2/1993 |
| JP | 11-209489 A | 8/1999 |
| JP | 2006-261198 A | 9/2006 |
| JP | 2007-027173 A | 2/2007 |
| JP | 2007-281054 A | 10/2007 |
| JP | 2009-070677 A | 4/2009 |
| JP | 2009-130200 A | 6/2009 |
| JP | 2009-543156 A | 12/2009 |
| KR | 10-2008-0005722 A | 1/2008 |
| TW | 1270895 | 9/2012 |
| WO | 2008/007874 A1 | 1/2008 |

OTHER PUBLICATIONS

Chinese Office Action issued Aug. 20, 2014 in Chinese Patent Application No. 201180017494.9.

* cited by examiner

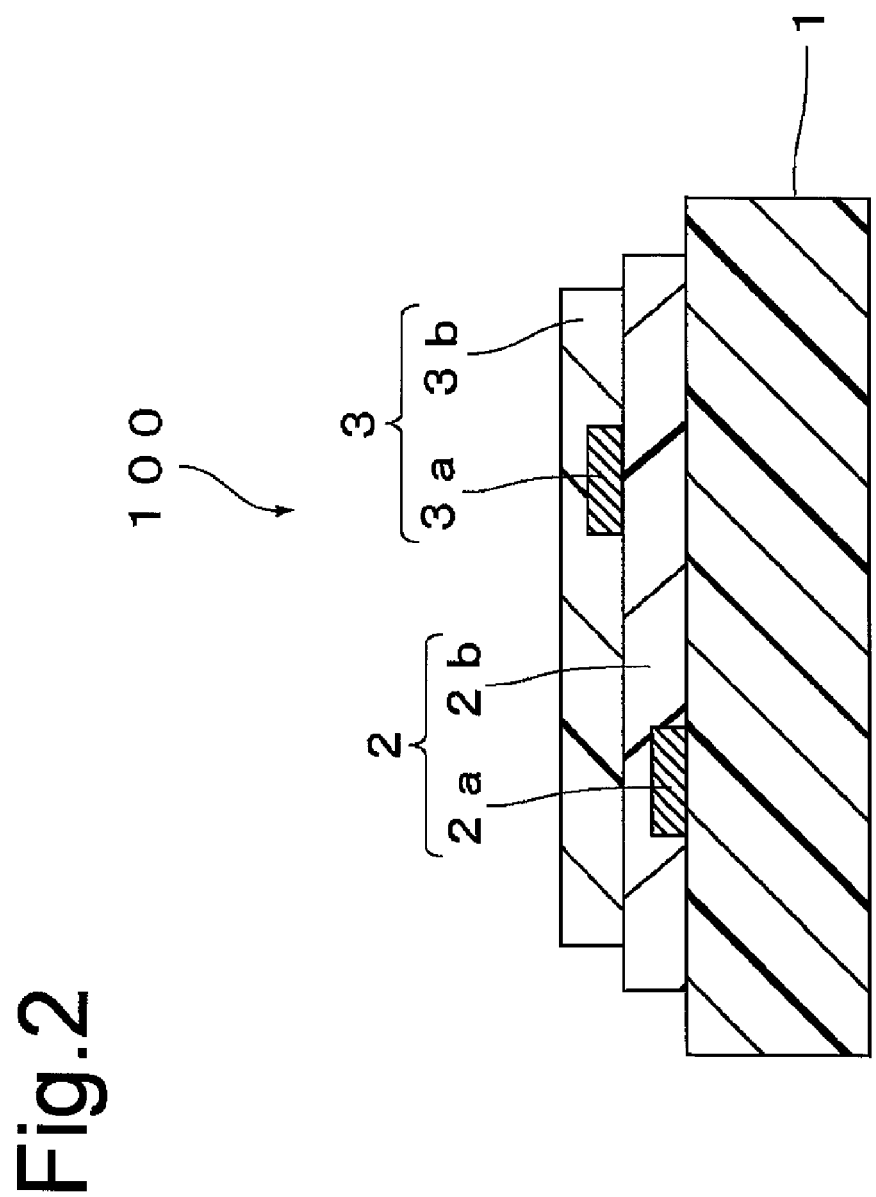

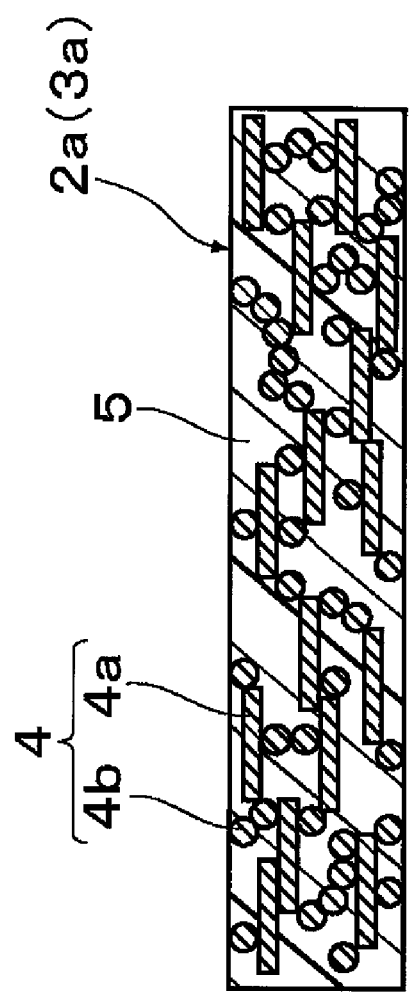

MEMBRANE WIRING BOARD

CROSS REFERENCE TO RELATED APPLICATIONS

This application is a Continuation of National Stage of International Application No. PCT/JP2011/058019 filed Mar. 30, 2011, claiming priority based on Japanese Patent Application No. 2010-084796 filed Apr. 1, 2010, the contents of all of which are incorporated herein by reference in their entirety.

TECHNICAL FIELD

The present invention relates to a membrane wiring board.

BACKGROUND ART

Membrane wiring boards are used as inter-board connection wiring materials of laptop computers and switching circuits for digital home appliances. Membrane wiring boards are obtained by printing silver paste onto a flexible film substrate made of plastic and the like to form a circuit layer (see Patent Document 1). Consequently, membrane wiring boards can be manufactured more easily and less expensively than flexible printed circuit (FPC) boards comprising a circuit layer formed by etching or plating copper on a plastic film. Thus, membrane wiring boards are coming to be used as inexpensive alternatives to FPC.

PRIOR ART DOCUMENTS

Patent Documents

Patent Document 1: Japanese Patent Application Laid-open No. 2006-261198

SUMMARY OF THE INVENTION

Problems to be Solved by the Invention

By the way, membrane wiring boards require protection of the circuit layer. In addition, multiple layers of circuit layers may be provided accompanying reductions in size of membrane wiring boards. Consequently, it is necessary to coat the circuit layers with an insulating coating layer.

However, when a circuit layer is formed on a substrate by printing silver paste, followed by forming an insulating coating layer by applying a resin composition on this circuit layer and curing, there are cases in which circuit resistance of the circuit layer increases considerably. In addition, the degree of this increase in circuit resistance varies according to the type of insulating coating layer, and depending on the type of insulating coating layer used, circuit resistance may become quite large. Consequently, there are limitations on the types of insulating coating layers that can be used.

With the foregoing in view, an object of the present invention is to provide a membrane wiring board in which changes in circuit resistance before and after coating the circuit layer with an insulating coating layer are adequately inhibited regardless of the type of insulating coating layer.

Means for Solving the Problems

As a result of conducting extensive studies to solve the above-mentioned problems, the inventor of the present invention presumed that the cause of the remarkable changes in circuit resistance of the circuit layer can be attributed to the following factors. Namely, when a circuit layer is coated with an insulating coating layer, there is the potential for the solvent contained in the insulating coating layer to penetrate into the circuit layer and cause a resin component contained in the circuit layer to swell or dissolve. The inventor of the present invention further considered that circuit resistance of the circuit layer may change considerably as mutually contacting silver particles moves apart as a result thereof. In addition, the solvent that penetrates into the circuit layer also differs according to the type of insulating coating layer. Consequently, the inventor of the present invention considered that the reason for the rate of change in circuit resistance varying according to the type of insulating coating layer is that the degree of swelling or dissolution of the resin component in the circuit layer varies according to the type of solvent. Therefore, the inventor of the present invention conducted extensive research focusing on the gel fraction in the circuit layer for the purpose of inhibiting swelling and dissolution of the resin component in the circuit layer. As a result, it was found that swelling or dissolution of the resin component of the circuit layer can be inhibited and, as a result thereof, the above-mentioned problems can be solved, by making the gel fraction of the resin component in the circuit layer to have at least a prescribed value, thereby leading to completion of the present invention.

Namely, the present invention is a membrane wiring board provided with an insulating substrate, and at least one circuit portion provided on the insulating substrate and obtained by coating a circuit layer formed by an electrically conductive paste containing electrically conductive particles with an insulating coating layer, wherein the circuit layer contains a resin component having a gel fraction of 90% or more.

According to this membrane wiring board, since the gel fraction of the resin component of the circuit layer in the circuit portion is 90% or more, swelling and dissolution of the resin component in the circuit layer are adequately inhibited and separation of electrically conductive particles is adequately inhibited. Consequently, a membrane wiring board is realized in which changes in circuit resistance before and after coating the circuit layer with the insulating coating layer are adequately inhibited regardless of the type of insulating coating layer.

In the above-mentioned membrane circuit board, the insulating coating layer is preferably obtained by curing an ultraviolet-curable resist.

In this case, in comparison with the case in which the insulating coating layer is obtained by curing a heat-curable resist, a membrane wiring board can be realized in which changes in circuit resistance of the circuit layer before and after coating the circuit layer with the insulating coating layer are more adequately inhibited.

In the above-mentioned membrane wiring board, the resin component is obtained by curing a resin composition containing a radical polymerizable resin composition, the radical polymerizable resin composition contains urethane acrylate oligomer, pentaerythritol triacrylate and pentaerythritol tetraacrylate, and the content of the radical polymerizable resin composition in the resin composition is preferably 70% by mass or more.

In this case, in comparison with the case in which the content of the radical polymerizable resin composition in the resin composition is less than 70% by mass, a membrane wiring board can be realized in which changes in circuit resistance of the circuit layer before and after coating the circuit layer with the insulating coating layer are more adequately inhibited.

Effects of the Invention

According to the present invention, a membrane wiring board is provided in which changes in circuit resistance when coating a circuit layer with an insulating coating layer are adequately inhibited regardless of the type of insulating coating layer.

BRIEF DESCRIPTION OF THE DRAWINGS

FIG. 2 is a cross-sectional view taken along line II-II of FIG. 1; and

FIG. 3 is an enlarged view showing the circuit layer of FIG. 2.

MODE FOR CARRYING OUT THE INVENTION

Figure 1:
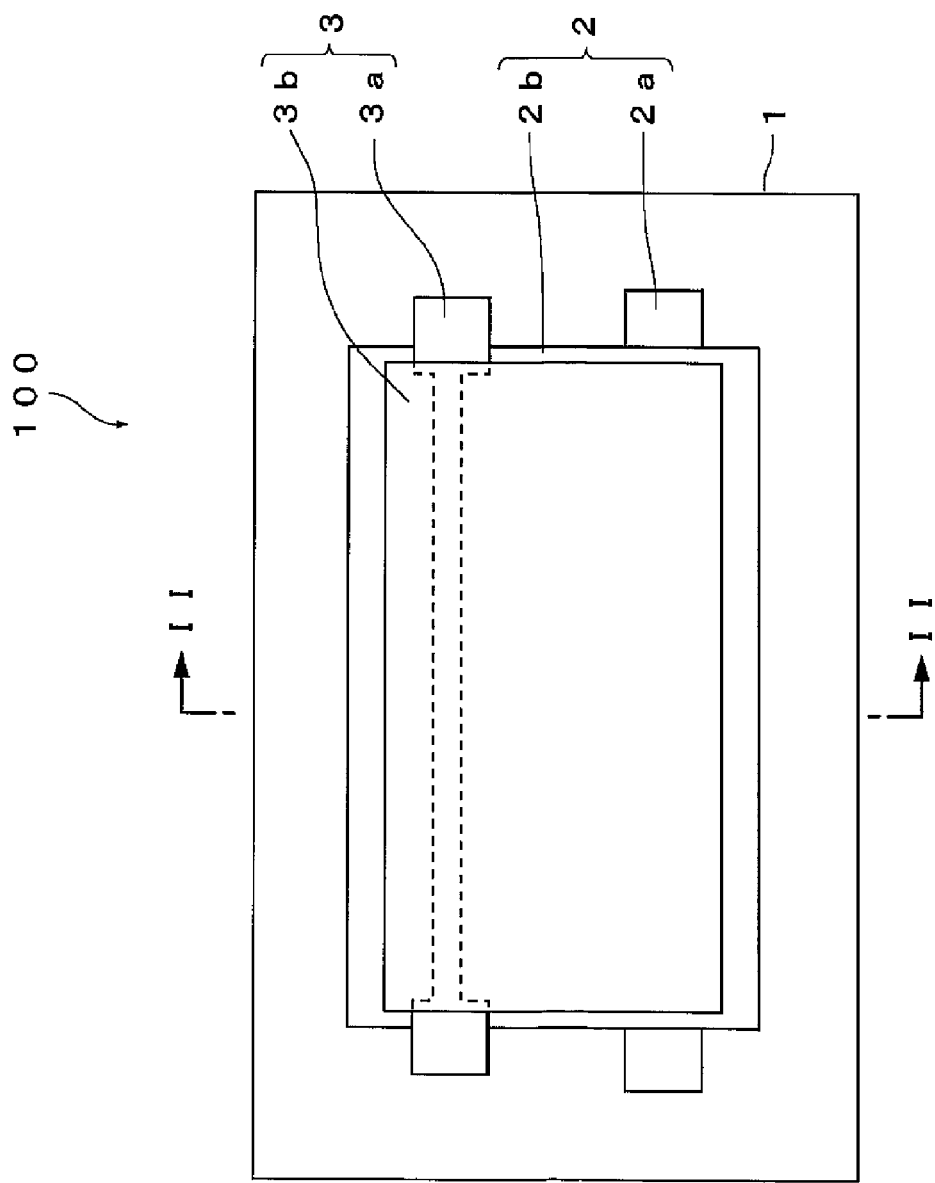
FIG. 1 is a top view showing an embodiment of a membrane wiring board of the present invention.

The following provides a detailed explanation of embodiments of the present invention using FIGS. 1 to 3.

FIG. 1 is a top view showing an embodiment of a membrane wiring board according to the present invention, FIG. 2 is a cross-sectional view taken along line II-II of FIG. 1, and FIG. 3 is an enlarged view showing the circuit layer of FIG. 2. As shown in FIGS. 1 and 2, a membrane wiring board 100 of the present embodiment is provided with an insulating substrate 1, a first circuit portion 2 provided on the insulating substrate 1, and a second circuit portion 3 provided on the first circuit portion 2.

The first circuit portion 2 is obtained by coating a circuit layer 2a provided on the insulating substrate 1 with an insulating coating layer 2b. In addition, the second circuit portion 3 is obtained by coating a circuit layer 3a provided on the insulating coating layer 2b of the first circuit portion 2 with an insulating coating layer 3b.

Both the circuit layer 2a and the circuit layer 3a are formed from an electrically conductive paste containing electrically conductive particles, and as shown in FIG. 3, the circuit layer 2a and the circuit layer 3a contains electrically conductive particles 4 and a resin component 5, and the resin component 5 has a gel fraction of 90% or more.

According to this membrane wiring board 100, as a result of making the gel fraction of the resin component 5 in the circuit layer 2a in the first circuit portion 2 to be 90% or more, swelling and dissolution of the resin component 5 in the circuit layer 2a are adequately inhibited, and separation of the electrically conductive particles 4 is adequately inhibited. In addition, as a result of making the gel fraction of the resin component 5 in the circuit layer 3a in the second circuit portion 3 to be 90% or more, swelling and dissolution of the resin component 5 in the circuit layer 3a are adequately inhibited, and separation of the electrically conductive particles 4 is inhibited. Consequently, according to the membrane wiring board 100, changes in circuit resistance in the circuit layer 2a before and after coating the circuit layer 2a with the insulating coating layer 2b and changes in circuit resistance of the circuit layer 3a before and after coating the circuit layer 3a with the insulating coating layer 3b are adequately inhibited regardless of the types of insulating coating layers 2b and 3b.

Here, the gel fraction of the resin component 5 of the circuit layers 2a and 3a is preferably 94% or more and more preferably 96% or more.

Next, an explanation is provided of a manufacturing method of the membrane wiring board 100.

First, the insulating substrate 1 is prepared. The insulating material that composes the insulating substrate 1 is normally composed of plastic. Examples of such plastic include polyester resins such as polyethylene terephthalate resin (PET) or polyethylene naphthalate resin (PEN), polyimide and polyetherimide.

Next, an electrically conductive paste is prepared. A mixture of the electrically conductive particles 4, a resin composition for forming the resin component 5 and a solvent is used for the electrically conductive paste.

(Electrically Conductive Particles)

The electrically conductive particles 4 may normally be flake-like electrically conductive particles, spherical electrically conductive particles or a mixture thereof.

The mean particle diameter of the electrically conductive particles 4 is normally 0.1 µm to 20 µm and preferably 0.5 µm to 10 µm although there are no particular limitations thereon.

As shown in FIG. 3, a mixture of flake-like electrically conductive particles 4a and spherical electrically conductive particles 4b is preferably used for the electrically conductive particles 4. In this case, it becomes easy for the spherical electrically conductive particles 4b to enter gaps between the flake-like electrically conductive particles 4a when drying the electrically conductive paste, thereby facilitating the securing of an electrically conductive pathway between the flake-like electrically conductive particles 4a by the spherical electrically conductive particles 4b even if the flake-like electrically conductive particles 4a separate. Here, the ratio of the mean particle diameter of the spherical electrically conductive particles 4b to the mean particle diameter of the flake-like electrically conductive particles 4a is preferably 0.1 to 1 and more preferably 0.25 to 0.5. In this case, electrically conductive pathways between the flake-like electrically conductive particles 4a are more easily secured by the spherical electrically conductive particles 4b even if the flake-like electrically conductive particles 4a separate. Furthermore, the particle diameters of the flake-like electrically conductive particles 4a and the spherical electrically conductive particles 4b refer to values calculated according to the following equation in the case of observing the electrically conductive particles with an electron microscope:

Particle diameter=(minimum length+maximum length)/2.

Furthermore, the spherical electrically conductive particles 4b refer to electrically conductive particles in which the ratio of maximum length to minimum length is 1 to 2. In addition, mean particle diameter refers to a value equal to 50% of a value measured by laser diffraction.

Silver particles, for example, can be used for the electrically conductive particles 4.

(Resin Composition)

A radical polymerizable resin composition, cationic polymerizable resin composition or unsaturated polyester resin, for example, can be used for the resin composition. Among these, a radical polymerizable composition is preferable from the viewpoint of reaction rate.

Here, examples of radical polymerizable resin compositions that can be used preferably include those containing a urethane acrylate oligomer, pentaerythritol triacrylate and pentaerythritol tetraacrylate (for example, UV-5501 manufactured by Nippon Synthetic Chemical Industry Co., Ltd.), and those containing a urethane acrylate oligomer, ε-caprolactone modified with an unsaturated fatty acid hydroxyalkyl ester and 2-hydroxyethylacrylate (for example, UV-7510B manufactured by Nippon Synthetic Chemical Industry Co., Ltd.). These can be used alone respectively or as a mixture thereof.

Here, in the case of using a radical polymerizable resin composition containing urethane acrylate oligomer, pentaerythritol triacrylate and pentaerythritol tetraacrylate, the content of the radical polymerizable resin composition in the resin composition is preferably 70% by mass or more and more preferably 80% by mass or more. In this case, in comparison with the case of the content of the radical polymerizable resin composition in the resin composition being less than 70% by mass, changes in circuit resistance of the circuit layer 2a before and after coating the circuit layer 2a with the insulating coating layer 2b can be more adequately inhibited. However, the content of the radical polymerizable resin composition in the resin composition is normally 100% by mass or less.

(Solvent)

Examples of solvents that can be used include organic solvents such as ethanol, propanol, tetrahydrofuran, isophorone, terpineol, triethylene glycol monobutyl ether, butyl cellosolve acetate and carbitol acetate. One type of these solvents can each be used alone or two or more types can be used in combination.

On a solid base, namely, in the case a value of 100% by mass is assigned to the total amount of the electrically conductive particles 4 and the resin composition which are solids, the electrically conductive particles 4 are preferably contained in the electrically conductive paste at a ratio of 70% by mass to 95% by mass, and the resin composition is preferably contained at a ratio of 5% by mass to 30% by mass. If the contents of the electrically conductive particles 4 and the resin composition are within the above-mentioned ranges, in addition to facilitating the realization of a gel fraction of 90% or more for the resin component 5 of the circuit layer 2a and the circuit layer 3a, it becomes easier to realize favorable electrical conductivity and printability.

Next, the above-mentioned electrically conductive paste is applied onto the insulating substrate 1 by a printing method. Examples of printing methods that can be employed include screen printing, gravure printing, transfer printing and roll coating.

Next, the electrically conductive paste is irradiated with an electron beam. At this time, the absorbed dose may normally be 100 kGy to 200 kGy. As a result of being irradiated with an electron beam, the resin composition in the electrically conductive paste is crosslinked (cured), and the resin component 5 is obtained having a gel fraction of 90% or more. At this time, the gel fraction can be increased by increasing the absorbed dose or the gel fraction of the resin component 5 can be reduced by reducing the absorbed dose. The circuit layer 2a is formed on the insulating substrate 1 in this manner.

Next, the circuit layer 2a is coated with the insulating coating layer 2b. The coating insulating layer 2b can be obtained by applying a resin composition onto the insulating substrate 1 so as to cover the circuit layer 2a followed by curing. At this time, an ultraviolet-curable resist or a heat-curable resist can be used for the resin composition. Here, the ultraviolet-curable resist is composed by containing an ultraviolet-curable resin and a photopolymerization initiator, while the heat-curable resist is composed by containing a heat-curable resin and a curing agent.

Examples of ultraviolet-curable resins include polyester (meth)acrylate, polyurethane(meth)acrylate and polyether (meth)acrylate. In the case of using a saturated polyester resin for the resin component 5 in the circuit layer 2a, polyurethane (meth)acrylate is preferable since it is more difficult to make the resin component 5 swell.

Curing of the resin composition can be carried out by irradiating the resin composition with ultraviolet light.

In the case of using a heat-curable resist for the resin composition, a saturated polyester resin, for example, can be used for the heat-curable resin. Moreover, polyisocyanate, for example, can be used for the curing agent.

In the case of using a heat-curable resist for the resin composition, the insulating coating layer 2b can be obtained by heating and curing the resin composition.

An ultraviolet-curable resist is preferably used for the resin composition. In this case, in comparison with the case of forming the insulating coating layer 2b using a heat-curable resist, the membrane wiring board 100 can be realized in which changes in circuit resistance before and after coating the circuit layer 2a with the insulating coating layer 2b are more adequately inhibited.

Next, an electrically conductive paste similar to that previously described is applied onto the insulating coating layer 2b by a printing. The electrically conductive paste is then cured by irradiating with an electron beam in the same manner as in the case of forming the circuit layer 2a. The circuit layer 3a is formed on the insulating coating layer 2b in this manner.

Finally, the circuit layer 3a is applied with the insulating coating layer 3b. In the case of the insulating coating layer 3b as well, a resin composition is coated and cured on the insulating coating layer 2b so as to cover the circuit layer 3a in the same manner as the insulating coating layer 2b. At this time, an ultraviolet-curable resist is preferably used for the resin composition in the same manner as in the case of the insulating coating layer 2b. In this case, changes in circuit resistance of the circuit layer 3a before and after coating the circuit layer 3a with the insulating coating layer 3b can be more adequately inhibited.

The membrane circuit board 100 is obtained in this manner.

The present invention is not limited to the above-mentioned embodiment. For example, although two layers of circuit portions are formed in the above-mentioned embodiment, only a single layer of a circuit portion may also be formed or three or more layers may be formed. In the case of forming three or more layers of the circuit portion, the step of forming a circuit layer on the circuit portion 3 using the electrically conductive paste and obtaining the circuit portion by forming an insulating coating layer by applying and curing a resin composition on the circuit layer is repeated.

EXAMPLES

Although the following provides a more specific explanation of the present invention by listing examples and comparative examples thereof, the present invention is not limited to the following examples.

Examples 1 to 9

First, an electrically conductive paste was prepared in the following manner. Namely, silver particles, a resin composition and a solvent were mixed and then kneaded with a triple roll mill to obtain an electrically conductive paste. At this time, the silver particles and the resin composition were mixed in the ratios shown in Table 1. Furthermore, the units of the values shown in Table 1 represent "percent by mass (mass %)" unless specifically indicated otherwise. In addition, the content of each component in the electrically conductive pastes shown in Table 1 indicates the content on a solid base, namely, in the case a value of 100% by mass is assigned to the total amount of solids contained therein. Solvent was added at 3 parts by mass to 20 parts by mass based on a value of 100 parts by mass for the solid content.

TABLE 1

| | Circuit Layer | | | | | | Characteristics | | |
|---|---|---|---|---|---|---|---|---|---|
| | Electrically Conductive Paste | | | | | | | Resistance | Rate of |
| | Silver Particles | | Radical Polymerizable Resin Composition | | | Gel fraction | Insulating Layer | Initial resistance R1 | after coating resist R2 | change in circuit resistance |
| | S-302 | S-602 | UV-5501 | UV-7501B | Initiator | (%) | Resist | (Ω) | (Ω) | (%) |
| Ex. 1 | 42.5 | 42.5 | 15 | 0 | 0 | 96 | XB-3027 | 13.9 | 15.6 | 12 |
| Ex. 2 | 85 | 0 | 15 | 0 | 0 | 94 | XB-3027 | 12.2 | 13.8 | 13 |
| Ex. 3 | 0 | 85 | 15 | 0 | 0 | 98 | XB-3027 | 19.1 | 21.3 | 12 |
| Ex. 4 | 65 | 20 | 15 | 0 | 0 | 95 | XB-3027 | 11.5 | 13 | 13 |
| Ex. 5 | 65 | 20 | 7.5 | 7.5 | 0 | 92 | XB-3027 | 13.2 | 15.2 | 15 |
| Ex. 6 | 65 | 20 | 0 | 15 | 0 | 93 | XB-3027 | 12.4 | 14.2 | 15 |
| Ex. 7 | 45 | 40 | 10 | 0 | 0 | 95 | XB-3027 | 14.6 | 16.5 | 13 |
| Ex. 8 | 40 | 45 | 20 | 0 | 0 | 98 | XB-3027 | 181 | 200 | 11 |
| Ex. 9 | 65 | 20 | 11.3 | 3.7 | 0 | 96 | XB-3027 | 12.5 | 14.1 | 13 |
| Ex. 10 | 42.5 | 42.5 | 15 | 0 | 0 | 96 | PTF-300G | 14.2 | 15.2 | 7 |
| Ex. 11 | 85 | 0 | 15 | 0 | 0 | 94 | PTF-300G | 12.5 | 13.5 | 8 |
| Ex. 12 | 0 | 85 | 15 | 0 | 0 | 98 | PTF-300G | 18.8 | 20.5 | 9 |
| Ex. 13 | 65 | 20 | 15 | 0 | 0 | 95 | PTF-300G | 11.7 | 12.6 | 8 |
| Ex. 14 | 65 | 20 | 7.5 | 7.5 | 0 | 92 | PTF-300G | 12.9 | 14.6 | 13 |
| Ex. 15 | 65 | 20 | 0 | 15 | 0 | 93 | PTF-300G | 12.2 | 13.9 | 14 |
| Ex. 16 | 45 | 40 | 10 | 0 | 0 | 95 | PTF-300G | 14.3 | 15.3 | 7 |
| Ex. 17 | 40 | 45 | 20 | 0 | 0 | 98 | PTF-300G | 175 | 186 | 6 |
| Ex. 18 | 65 | 20 | 11.3 | 3.7 | 0 | 96 | PTF-300G | 13.4 | 14.5 | 8 |
| Comp. Ex. 1 | 65 | 20 | 13.5 | 0 | 1.5 | 60 | XB-3027 | 12.5 | 30.5 | 144 |
| Comp. Ex. 2 | 65 | 20 | 13.5 | 0 | 1.5 | 60 | PTF-300G | 12.6 | 20.4 | 62 |
| Comp. Ex. 3 | — | | | | | 80 | XB-3027 | 10.4 | 14.5 | 39 |
| Comp. Ex. 4 | — | | | | | 80 | PTF-300G | 9.6 | 11.5 | 20 |

More specifically, the following silver particles, resin compositions and solvent were used.

(1) Silver Particles

S-303: Daiken Chemical Co., Ltd. (flake-like silver particles having a mean particle diameter of 2.4 μm)

S-602: manufactured by Daiken Chemical Co., Ltd. (spherical particles having a mean particle diameter of 1.07 μm)

(2) Resin Compositions

UV-5501: Radical polymerizable resin composition manufactured by Nippon Synthetic Chemical Industry Co., Ltd.

UV-7501B: Radical polymerizable resin composition manufactured by Nippon Synthetic Chemical Industry Co., Ltd.

(3) Solvent

Carbitol acetate

Next, the above-mentioned electrically conductive paste was applied onto a plastic substrate having a thickness of 75 μm and composed of polyethylene terephthalate to a thickness of 10 μm by screen printing so as to form a linear printing pattern, and this printing pattern was irradiated with an electron beam at an accelerating voltage of 300 kV and absorbed dose of 200 kGy using an electron beam radiation device to form a circuit layer.

Next, a heat-curable resist (XB-3027, manufactured by Fujikura Kasei Co., Ltd.) shown in Table 1 was applied onto the circuit layer obtained in the manner described above by screen printing so as to expose both ends of the circuit layer, and this resist was then cured by heating for 5 minutes at 150° C. using an IR oven to form an insulating coating layer. Membrane wiring boards were obtained in this manner.

Examples 10 to 18

Membrane wiring boards were obtained in the same manner as Example 1 with the exception of applying an ultraviolet-curable resist (PTF-300G, manufactured by Goo Chemical Co., Ltd.) shown in Table 1 onto each of the circuit layers obtained in Examples 1 to 9 bp screen printing so as to expose both ends of the circuit layers, and curing the resist by irradiating with ultraviolet light at an intensity of 1000 mJ/cm² using a metal halide lamp to form an insulating coating layer having a thickness of 20 μm.

Comparative Example 1

A membrane wiring board was obtained in the same manner as Example 1 with the exception of applying an electrically conductive paste having the composition shown in Table 1 onto a plastic substrate by screen printing to form a linear printing pattern, followed by curing the printing pattern by heating for 5 minutes at 150° C. using an IR oven to form a circuit layer. Furthermore, the electrically conductive paste of Comparative Example 1 was composed of silver particles, radical polymerizable resin composition, initiator and solvent, and azobisisobutyronitrile (AIBN) was used for the initiator.

Comparative Example 2

A membrane wiring board was obtained in the same manner as Example 10 with the exception of applying an electrically conductive paste having the composition shown in Table 1 onto a plastic substrate by screen printing to form a linear printing pattern, followed by curing the printing pattern by heating for 5 minutes at 150° C. using an IR oven to form a circuit layer. Furthermore, the electrically conductive paste of Comparative Example 2 was composed of silver particles, radical polymerizable resin composition, initiator and solvent, and azobisisobutyronitrile (AIBN) was used for the initiator.

Comparative Example 3

A membrane wiring board was obtained in the same manner as Example 1 with the exception of using PAF-25F manufactured by Goo Chemical Co., Ltd. for the electrically conductive paste and making the gel fraction of the resin component in the circuit layer to be as shown in Table 1.

Comparative Example 4

A membrane wiring board was obtained in the same manner as Example 10 with the exception of using PAF-25F (Goo Chemical Co., Ltd.) for the electrically conductive paste and making the gel fraction of the resin component in the circuit layer to be as shown in Table 1.

<Gel Fraction>

Gel fraction was determined in the following manner. Namely, a portion of the circuit layers obtained in Examples 1 to 18 and Comparative Examples 1 to 4 were cut out for use as test pieces, and after immersing the test pieces for 1 hour in MEK(methyl ethyl ketone), the test pieces were dried for 1 hour at 105° C. followed by measuring the change in weight of the test pieces before and after immersion to calculate the gel fraction.

<Evaluation of Circuit Resistance>

The membrane wiring boards obtained in Examples 1 to 18 and Comparative Examples 1 to 4 were evaluated for circuit resistance in the manner described below.

In the middle of the manufacturing process of the membrane wiring boards obtained in Examples 1 to 18 and Comparative Examples 1 to 4, a resistance value (R1) of the circuit layer prior to coating the circuit layer with the insulating coating layer was measured as an initial resistance, and a resistance value (R2) of the circuit layer was measured following completion of the membrane wiring boards. The results are shown in Table 1. Furthermore, the resistance values R1 and R2 were measured according to the four-probe method using a digital multimeter. The rate of change in resistance was calculated based on the following equation:

Rate of change in resistance (%)=100×(R2−R1)/R1

The results are shown in Table 1.

According to the results of Table 1, it was found that the membrane wiring boards of Examples 1 to 18 having circuit layers in which the gel fraction was 90% or more were able to adequately inhibit changes in circuit resistance as compared with the membrane wiring boards of Comparative Examples 1 to 4 having circuit layers in which the gel fraction was less than 90%. In addition, it was found that changes in circuit resistance were also able to be adequately inhibited regardless of the type of insulating coating layer.

Thus, according to the membrane wiring board of the present invention, changes in circuit resistance before and after coating a circuit layer with an insulating coating layer were confirmed to be adequately inhibited regardless of the type of insulating coating layer by making the gel fraction of the resin component in the circuit layer to be 90% or more.

EXPLANATION OF REFERENCE NUMERALS

1: insulating substrate, 2: first circuit portion, 3: second circuit portion, 2*a*, 3*a*: circuit layers, 2*b*, 3*b*: insulating coating layers, 4: electrically conductive particles, 4*a*: flake-like electrically conductive particles, 4*b*: spherical electrically conductive particles, 5: resin component, 100: membrane wiring board

The invention claimed is:

1. A membrane wiring board comprising:
   an insulating substrate; and
   at least one circuit portion provided on the insulating substrate and obtained by coating a circuit layer, formed by an electrically conductive paste containing electrically conductive particles, with an insulating coating layer, wherein
   the circuit layer contains a resin component having a gel fraction of 90% or more;
   wherein, in the case a value of 100% by mass is assigned to a total amount of the electrically conductive particles and the resin composition in the electrically conductive paste, the electrically conductive particles are contained at a ratio of 70% by mass to 95% by mass and the resin composition is contained at a ratio of 5% by mass to 30% by mass.

2. The membrane wiring board according to claim 1, wherein the insulating coating layer is obtained by curing an ultraviolet-curable resist.

3. The membrane wiring board according to claim 1, wherein
   the resin component is obtained by curing a resin composition containing a radical polymerizable resin composition,
   the radical polymerizable resin composition contains urethane acrylate oligomer, pentaerythritol triacrylate and pentaerythritol tetraacrylate, and
   the content of the radical polymerizable resin composition in the resin composition is 70% by mass or more.

4. The membrane wiring board according to claim 1, wherein the electrically conductive particles are a mixture of flake-like electrically conductive particles and spherical electrically conductive particles.

5. The membrane wiring board according to claim 4, wherein a ratio of the mean particle diameter of the spherical electrically conductive particles to the mean particle diameter of the flake-like electrically conductive particles is 0.1 to 1.

\* \* \* \* \*